United States Patent [19]

Chambers et al.

[11] 4,194,962

[45] Mar. 25, 1980

[54] CATHODE FOR SPUTTERING

[75] Inventors: Douglas L. Chambers; Chong T. Wan Wan, both of Nashville, Tenn.

[73] Assignee: Advanced Coating Technology, Inc., Franklin, Tenn.

[21] Appl. No.: 971,196

[22] Filed: Dec. 20, 1978

[51] Int. Cl.² .......................................... C23C 15/00
[52] U.S. Cl. ................................................ 204/298
[58] Field of Search ............... 204/192 R, 192 C, 298

[56] References Cited

U.S. PATENT DOCUMENTS

| | | | |
|---|---|---|---|
| 3,414,503 | 12/1968 | Brichard | 204/298 |
| 3,738,928 | 6/1973 | Glaser et al. | 204/298 |
| 3,878,085 | 4/1975 | Corbani | 204/298 |
| 3,956,093 | 5/1976 | McLeod | 204/192 |
| 4,013,532 | 3/1977 | Cormia et al. | 204/192 C |
| 4,041,353 | 8/1977 | Penfold et al. | 315/267 |
| 4,116,806 | 9/1978 | Love et al. | 204/298 |
| 4,126,530 | 11/1978 | Thornton | 204/192 EC |

*Primary Examiner*—Aaron Weisstuch
*Attorney, Agent, or Firm*—Watts, Hoffmann, Fisher & Heinke Co.

[57] ABSTRACT

A system for sputter coating architectural glass is disclosed which includes an evacuable enclosure, a conveyor for moving glass to be coated along parallel paths, an elongated sputtering cathode supported between the paths, and structure by which ionizable gas is introduced into the enclosure. The cathode creates a continuous band of plasma extending about it through a region defining laterally spaced first and second sections extending generally parallel to glass on respective sides of the cathode and return sections joining the ends of the laterally spaced sections. The cathode includes sputtering material target face portions extending adjacent and parallel to the plasma sections and a magnetic field directing system for constraining the plasma flow in the sections to extend substantially uniformly over the target face portions.

16 Claims, 5 Drawing Figures

CATHODE FOR SPUTTERING

BACKGROUND OF THE INVENTION

1. Field of the Invention

The present invention relates to sputter coating systems and more particularly to sputter coating systems used for high volume production of relatively large size coated products.

2. The Prior Art

Extremely thin coatings can be applied to substrates by a process generally known as "sputtering." Sputtering is usually accomplished by bombarding a "target" formed from a desired coating material, such as gold, with ions so that individual atoms of the coating material are dislodged from the target and strike and adhere to the substrate. Generally the sputtering process is carried out under low pressure conditions (e.g., pressures of from 1 to 50 microns) with the target forming part of a cathode electrode from which electrons are emitted. An inert gas, such as Argon, is admitted to the vicinity of the cathode where the gas is ionized producing a plasma formed of positively charged gas ions and electrons. The ions are accelerated toward the target and strike the target with sufficient energy that target atoms are sputtered onto the substrate.

Some prior art sputtering systems employed so-called "post" electrodes in that the cathode was formed by an elongated post-like rod, or tube, or target material connected to a negative terminal of a D.C. power supply. Electrons emitted from these electrodes tended to disperse in all directions from the electrode and ionize the gas.

These systems were inefficient because in order to assure adequate ionization for sputtering the cathode had to be operated at high power levels and a relatively great number of gas atoms had to be present thus undesirably raising the pressure levels at which sputtering was accomplished. Secondly, sputtering tended to occur omnidirectionally from the electrodes and thus was not effectively directed toward the substrate being coated. Examples of systems employing such electrodes are disclosed by U.S. Pat. Nos. 3,738,928 and 3,414,503.

Efficiency of ionizing the gas was improved by the use of magnetic fields which were oriented to confine emitted electrons in regions close to the target surface. This technique, known as magnetic enhancement, was carried out by supporting magnets on the cathodes in orientations assuring that emitted electrons were constrained to remain relatively close to the surface of the sputtering target. Confining electrons adjacent the target surface causes increased numbers of collisions between the gas and the electrons thus increasing the ionization efficiency. This tended to reduce the cathode voltage requirements because fewer electrons had to be produced to accomplish a given amount of sputtering. Moreover a smaller quantity of gas could be admitted to the chamber to achieve the same amount of ionization. This permitted lower operating pressures with less interference between sputtered atoms and gas atoms in the enclosure.

In some proposals the shape of the magnetically enhanced cathode was such that the sputtering occurred primarily in a given direction. In one prior art construction the cathode employed a planar target plate having bar magnets supported beneath it in an annular array. The fields from these magnets arched over the target surface and collectively defined a "race track", or loop shaped region over the target surface in which the electrons tended to be confined. The magnetic fields also induced motion of the electrons in one direction through the region so that a continuous flow of electrons circulated around the track, or loop, in a relatively narrow band adjacent the surface of the target.

Gas molecules entering the electron flow were ionized thus forming a plasma in the region. The ions subsequently struck the target face adjacent the region. Atoms of the target material emitted as a result of the ion bombardment were uncharged and thus were substantially unaffected by the magnetic fields and the electrons during their flight to the substrate. This type of electrode construction is disclosed, for example, by U.S. Pat. Nos. 3,956,093 and 4,013,532.

In another proposed construction an annular target had magnets supported about its outer periphery so that emitted electrons were swept around the inner peripheral face of the target. A substrate placed within the target periphery was sputtered from all directions around the target periphery. See, for example, U.S. Pat. No. 3,878,085.

Cathodes of the character referred to tended to be eroded along narrow zones in the immediate vicinity of the electron flow path. This reduced the life of the target. A proposal was made in U.S. Pat. No. 3,956,093 for varying the elecron flow path in order to increase the size of the target erosion zone but substantial areas of the target still remained essentially uneroded.

Targets are frequently constructed from materials which themselves are extremely costly and/or are difficult and expensive to fabricate. Accordingly, localized severe target erosion is highly undesirable because it shortens the effective life of the target and requires relatively frequent electrode replacements. Moreover, in installations for quantity production of sizable sputtered products, such as architectural glass, replacement of electrodes in large enclosures necessitates venting the enclosures to atmosphere for replacement and subsequently pumping the enclosures back down to operating vacuum level. This is a time consuming and expensive interruption of production. Still further because the sputtering occurred over a small target area the sputtering rate was limited, thus limiting the production rate.

Using cathodes of the character referred to above was also somewhat ineffective for high volume production of articles such as architectural glass because only one face of one piece of glass could be coated at a time using one electrode. If, for example, two sheets of glass were to be coated simultaneously in order to increase production rates, two of the electrodes would have to be employed. A recent proposal has been made for constructing a two sided cathode formed by opposed separate target plates having a single array of magnets supported between them (e.g., as in U.S. Pat. No. 4,116,806). The magnets confine the electrons and ions to continuous loops extending over each target plate.

SUMMARY OF THE INVENTION

The present invention provides a new and improved sputtering system which is so constructed and arranged that substrates on opposite sides of a magnetically enhanced cathode target are simultaneously sputter coated as a result of establishment of a continuous band or belt of plasma which extends over broad target areas adjacent the respective substrates enabling relatively high production rates while increasing sputtering target life and efficiency.

In a preferred embodiment of the invention an evacuable enclosure is provided with a conveyor system along which substrates to be coated are moved on substantially parallel paths. A cathode supported between the paths creates the band or belt of plasma having first and second sections extending generally parallel to substrates moving along the respective paths and short return sections between ends of the first and second sections. The cathode includes first and second sputtering material faces which respectively extend adjacent and parallel to the first and second plasma belt sections and magnetic field directing structure for confining the plasma belt sections close to and distributed substantially uniformly across the first and second faces.

The preferred cathode construction includes an elongated electrically conductive support structure connected to an electrical power supply, a sputtering target extending longitudinally of and circumferentially about the support structure, and a magnetic field directing system for confining emitted electrons in the vicinity of and distributed relatively uniformly across the target face.

The target face is formed by first and second target face portions extending along the length of the supporting structure and facing differing directions. Bridging face portions extend between the target face portions at their opposite ends and across the ends of the electrode.

The magnetic field directing system includes magnets for producing magnetic fields and magnetic field conducting members, the latter extending longitudinally along the support structure and along respective lateral sides of the target face portions. The field conducting members control the magnetic field adjacent the target faces to confine and distribute the plasma close to and over the full area of each target face. Accordingly, erosion due to the sputtering occurs relatively evenly across the target faces.

The magnets can be of any type but are preferably permanent magnets magnetically coupled to the field conducting members and distributed along the target face to induce movement of emitted electrons about the electrode.

In the preferred electrode construction the field directing members include magnetically conductive elements which clamp the target faces in place to the electrode. This avoids the necessity for machining the target to provide mounting screw holes, etc. Target materials which are difficult to machine are readily usable with the new electrode because they only need to be formed from simple rectangular plates.

The field directing members further include magnetically conductive plates, one covering each lateral side of the electrode, to which the clamping elements are connected. The magnets are supported by and between the plates with the magnetic poles aligned so that the magnetically conductive plates have opposite polarities.

Other features and advantages of the invention will become apparent from the following detailed description of a preferred embodiment made in reference to the accompanying drawings.

DESCRIPTION OF A PREFERRED EMBODIMENT

Figure 1:
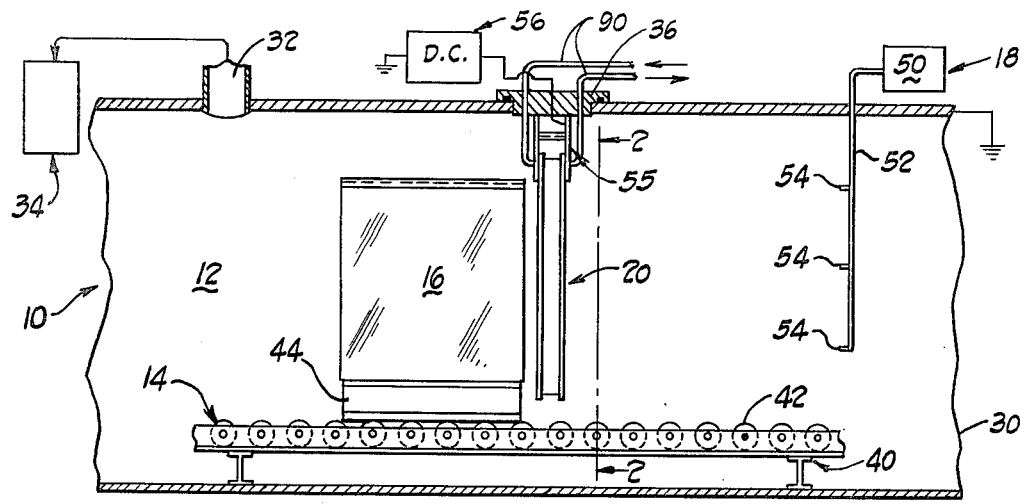
FIG. 1 is a schematic cross sectional view of a portion of a sputter coating system embodying the present invention.

A portion of a sputter coating system 10 embodying the present invention is illustrated schematically by FIG. 1 of the drawings. The system 10 includes an evacuable enclosure 12 containing a conveyor system 14 for moving substrates 16 to be coated along parallel spaced paths through the enclosure 12, a source 18 of inert, ionizable gas constructed to introduce small quantities of the gas into the enclosure 12 and a magnetically enhanced cathode 20. The system 10 is a relatively large scale coating operation with the substrates 16, in the preferred embodiment of the invention, formed by sheets of architectural glass measuring 4-6 feet on a side. The cathode 20 is disposed between the substrate travel paths and is effective to establish a continuous band of plasma about it to produce sputtering from opposite faces of the cathode onto the substrates 16 passing the cathode.

The enclosure 12 is illustrated schematically and in part as a pressure vessel having a generally cylindrical structurally strong wall 30 with a pumping duct 32 opening into it through which the enclosure is evacuated by a vacuum pump system schematically indicated by the reference character 34. It should be understood that the system 34 is schematically illustrated and preferably includes multiple pumps of different suitable types to enable quick and efficient pumping of the enclosure down to its operating pressure of from 1-3 microns. The enclosure 12 is equipped with one or more sealed bulkhead doors, not shown, to enable loading and unloading of substrates. The cathode 20 is illustrated as suspended from the uppermost section of the wall 30 via a sealed hatch-like cover 36 which is removable to enable cathode replacement.

Figure 2:
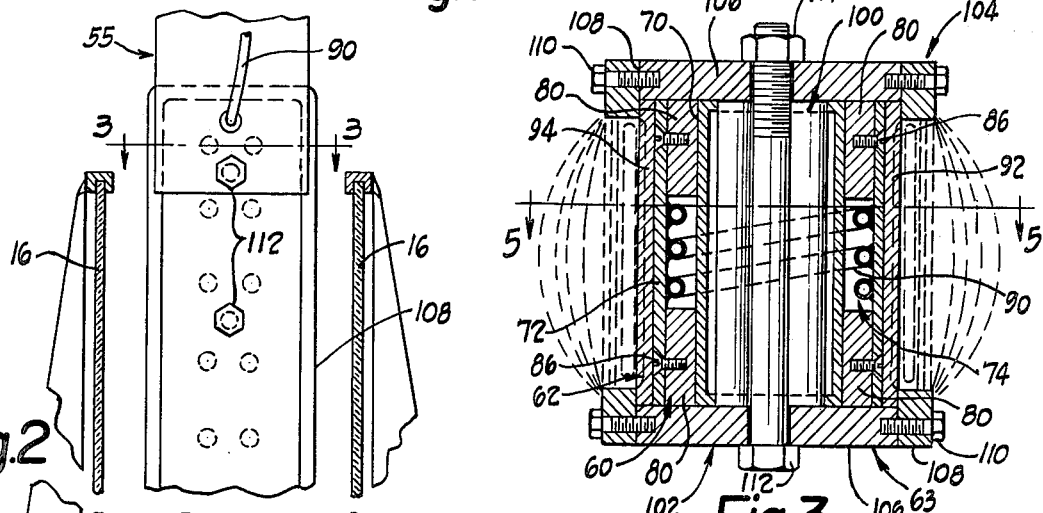
FIG. 2 is a fragmentary view of a portion of the system of FIG. 1 seen approximately from the plane indicated by the line 2—2 of FIG. 1.

The conveyor system 14 is schematically illustrated in FIGS. 1 and 2 as formed by two identical conveyors effective to move substrates 16 along generally parallel paths through the enclosure 12. Each conveyor includes a supporting base 40 attached to the wall 30 and extending along and within the enclosure 12 and rollers 42 supported by the base by which substrates are moved through the enclosure. The rollers 42 are preferably "active", or driven rollers connected by a suitable drive transmission to a driving motor. The transmission and driving motor may be of any suitable construction and are not illustrated by the drawings. Also included within the conveyor system 14 are substrate support frames 44 which are schematically illustrated as resting upon the rollers 42 and supporting the substrates on edge for movement along the respective paths. The supporting frames 44 are removable from the respective conveyors to enable loading and unloading of substrates outside the enclosure 12.

The gas source 18 is effective to direct an inert ionizable gas, such as Argon, into the enclosure between the substrate paths of travel and generally towards the cathode 20. The gas source 18 is illustrated as including a storage tank 50 for liquefied or compressed Argon and a conduit 52 leading from the tank 50 through the wall 30 to a series of vertically spaced nozzles 54 located beyond the cathode 20 from the pumping duct 32. At the operating pressure of the enclosure 12, i.e., 1–3 microns, the mean free path of the gas molecules admitted into the enclosure is extremely long and it is important therefore to locate the nozzles 54 in line with the cathode 20 rather than on one side or the other of the substrate paths of travel. Otherwise the substrates themselves would form "seals" and prevent the Argon molecules from reaching the vicinity of the cathode.

The cathode 20 coacts with the gas to establish a plasma band, or belt, extending continuously about the electrode having first and second plasma belt sections extending along respective substrate faces and return sections extending transversely to the substrate travel direction. The plasma belt location is illustrated by broken lines in FIGS. 3 and 4. Positive ions from the first and second plasma belt sections are accelerated into the cathode causing sputtering from the cathode to the adjacent substrate. In a preferred and illustrated embodiment of the invention the cathode 20 includes a mounting system 55 by which it is suspended in the enclosure 12 and electrically connected to a power supply 56, a sputtering target supporting structure 60 and associated sputtering target 62 (FIGS. 3–5), and a magnetic enhancement system 63.

The illustrated electrode mounting system 55 includes a mounting bracket which depends from the hatchway cover 36 and is attached to a cathode bracket by suitable detachable fasteners. The mounting brackets serve both to detachably connect the cathode to the cover 36 for mounting the cathode and to electrically connect the cathode to the power supply 56. The mounting brackets can be of any suitable constructional size and shape, are preferably formed by a structurally strong electrically conductive nonmagnetic material, e.g. aluminum or copper, and are illustrated schematically. The mounting brackets are electrically insulated from the enclosure wall 30 which itself is electrically grounded to form the system anode.

The power supply 56 can be of any suitable construction capable of providing at least 40 amps, D.C. at 600 volts. The negative power supply terminal is connected to the cathode while the positive terminal is grounded like the enclosure 12.

Figure 3:
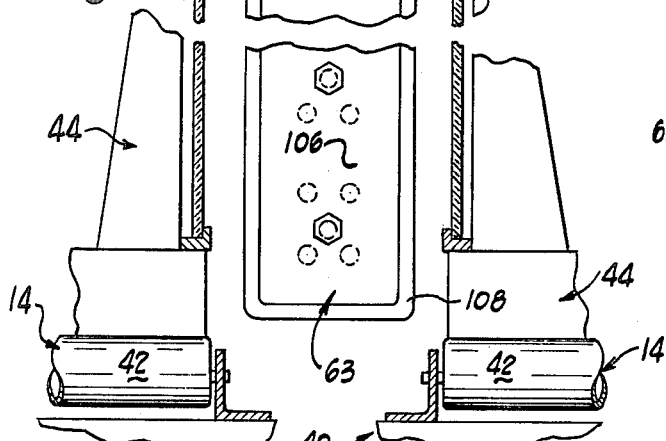
FIG. 3 is a cross sectional view seen approximately from the plane indicated by the line 3—3 of FIG. 2.
Figure 5:
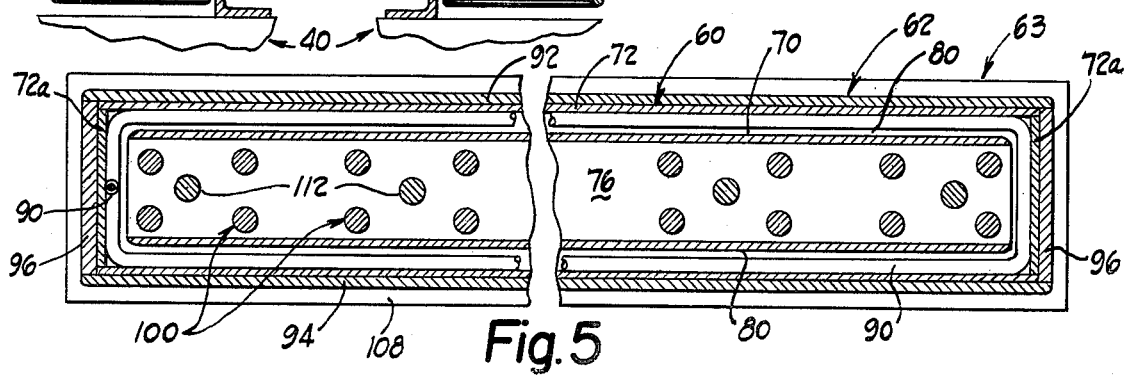

The support structure 60 is constructed to enable easy replacement of the target 62, assure electrical continuity with the power supply 56 while avoiding interference with the fields produced by the magnetic system 63, and to maintain the cathode at desirable operating temperature levels. In the illustrated embodiment of the invention, and as best seen in FIGS. 3 and 5, the structure 60 includes a central core 70, a target support, or carrier 72 connected to the core 70 and a coolant system 74.

The illustrated core 70 is formed by a nonmagnetic electrically conductive base member 76 and spacer bars 80. The member 76 is formed by a tubular aluminum extrusion or casting. The spacer bars extend longitudinally along the base member 76 and are spaced apart on opposite faces of the base member to define a slot-like longitudinal space on each of the base member faces. The spacer bars 80 are formed from the same kind of material as the core and are attached to the base member 76 by screws 82. The opposed lateral sides of the base member 76 define a series of openings which, in part, communicate the interior of the base member with the inside of the enclosure 12 so that the interior of the base member is evacuated when the enclosure is pumped down.

The target support, or carrier, 72 assures electrical continuity between the target and the power supply and transfers heat from the target. The target carrier is mounted on the support structure 60 and formed of a nonmagnetic material which has a high heat and electrical conductivity (preferably copper). The carrier is shaped to define an elongated rectangular band detachably connected to the support structure 60 by screws 86 threaded into the spacer bars 80. The target carrier can be formed by individual planar rectangular copper members each assembled to the core or by a single unit of brazed, or otherwise bonded, copper plate components. However formed, all parts of the target carrier have electrical continuity with the remainder of the support structure 60 and each other part of the target carrier itself.

The target carrier defines bight portions 72a which extend across the opposite ends of the cathode. The illustrated base member and spacer bars do not extend across the ends of the support structure 60 but the bight portions 72a are rigidly attached to the remainder of the target support and do not require additional support.

The preferred coolant system 74 is formed by a copper coolant conduit 90 helically coiled about the inside of the target carrier in the slot-like space between the bars 80. The conduit 90 is soft soldered to the interior of the target support to assure maximum heat conduction from the target support to the coolant. Intake and discharge ends of the conduit 90 extend through the wall 30 via the cover 36 (See FIG. 1) to a coolant source which can be a commonly available source of tapwater. The coolant conduit sections leading away from the outside of the enclosure are formed from plastic or other suitable electrical insulating material.

The preferred sputtering target 62 extends about the cathode and conforms to the shape of the target carrier, i.e. the target has a rectangular band or belt-like configuration. The sputtering target is mounted in electrical continuity with the carrier 72 and core 70 so that the target is at the voltage level of the negative power supply terminal. The sputtering target includes first and second target face portions 92, 94, which face oppositely from the cathode toward a respective adjacent one of the substrate travel paths and bridging portions 96 extending between adjacent ends of the target face portions.

In the preferred embodiment the bridging target portions are fashioned from planar rectangular plates of nonmagnetic stainless steel or some other inexpensive easily formed nonmagnetic material while the first and second target face portions are formed from rectangular elongated plates of sputter coating material. The lengths of the first and second target face portions are such that the target face portions each extend at least 5 cm. beyond the upper and lower edges of the substrate being coated to assure substantially uniform coating of the marginal portions of the substrate (the distance between the planes of the substrate and target face portion being around 5 cm).

Although sputtering does occur from the faces of the bridging portions 96, none of the material sputtered from these portions strikes the substrates. Sputtering occurs along a line-of-sight from the sputtering surface and since the planes of the bridging target portions are beyond the upper and lower edges of the substrates the material from the bridging target portions is not deposited on the substrates. Hence the sputter coating which occurs is limited to the material forming the first and second target face portions. Erosion of the bridging portions 96 occurs but these portions are made from materials which are inexpensively fabricated and usually of relatively low intrinsic value, at least compared to the value of the material forming the first and second target face portions.

The system 63 includes a magnetic field producing structure 100 and field directing members 102, 104 which coact to establish and direct a magnetic field for maintaining the plasma close to and distributed substantially uniformly across the width of the target face portions. In a preferred embodiment of the invention the field directing members 102, 104 are formed by a paramagnetic material, such as magnetic stainless steel.

Each field directing member includes a plate 106 shaped substantially to conform to the silhouette of the cathode and overlying one lateral side of the cathode, and a target clamping element 108 detachably connected to the periphery of the associated plate 106 by screws 110 (FIG. 3). The clamping element 108 is, in the illustrated embodiment, a rectangular shaped framework which fits snugly about the periphery of the plate 106 and extends along one lateral side of the target face portions 92, 94 and the bridging portions 96. When the screws 110 are tightened the clamping elements engage the face portions to both secure the target plates in place on the electrode and establish electrical contact between the target and the target carrier. The plates 106 and target clamping elements 108 coact to provide for positive mounting of target plates of virtually any desired material to the cathode without the necessity for machining the target plates by drilling holes, etc. which might otherwise be required for mounting.

Figure 4:
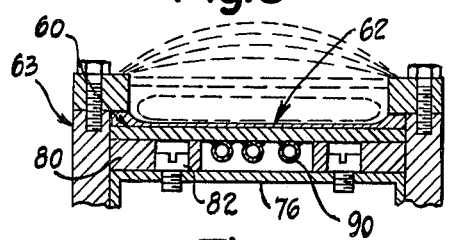
FIG. 4 is an enlarged fragmentary view of part of the apparatus illustrated by FIG. 3; and, FIG. 5 is a cross sectional view seen approximately from the plane indicated by the line 5—5 of FIG. 3.

In addition the clamping elements and plates are magnetic conductors and as such direct the magnetic field over and across the target face portions 92, 94 as illustrated by broken lines in FIGS. 3 and 4. This effectively distributes the plasma evenly across the target plates so that sputtering occurs uniformly from the exposed target face portions and the life of the target is maximized. FIG. 4 of the drawings illustrates the target erosion pattern in cross-section. The only portions of the target which are not consumed are the narrow marginal sections which are clamped by the elements 108 and these can be quite small.

The plates 106 are detachably clamped to the support structure 60 by bolt and nut fasteners 112. The bolts extend through clearance holes 114 in the plates 106 and aligned openings in the core 70. Additional vent openings may be formed in the plates 106 which communicate directly with holes in the core 70 to assure that the central space of the core 70 is evacuated along with the rest of the enclosure 12.

The magnetic field producing structure 100 both produces the plasma confining magnetic field and causes circulation of the plasma about the cathode. The structure 100 is preferably formed by a plurality of permanent bar-type magnets having their opposite ends supported respectively by the plates 106. The magnetic poles are aligned so that the north pole of each magnet is supported by one plate 106 and the respective south poles are supported by the other plate. The magnets are spaced apart about the cathode in a belt-shaped array within the perimeter of the target and just inside the target carrier inner periphery. The spaced magnets are effective to induce movement of the electrons in the plasma around the cathode through the plasma region.

The new cathode construction enables substantial flexibility of usage. For example, if desirable, side by side target plates of dissimilar sputtering materials can be clamped in place on the target carrier so that multiple sputtering materials can be placed on each of two substrates simultaneously from a single electrode.

The new cathode can also be "compounded" simply by constructing a series of two or more cathodes connected in common to a power supply and coolant source with adjacent cathodes sharing the intervening magnetic field directing plate 106. This construction enables the use of multiple target materials or increased sputtering rates of one target material applied to each of the compounded cathodes.

While only a single preferred embodiment of the invention has been illustrated and described in detail the invention is not to be considered limited to the precise construction shown. Various adaptations, modifications and uses of the invention may occur to those skilled in the art to which the invention relates and the intention is to cover all such adaptations, modifications and uses which fall within the spirit or scope of the appended claims.

What is claimed is:
1. A sputtering cathode comprising:
 (a) an elongated electrically conductive support structure;
 (b) sputtering target means defining a band-like target face extending longitudinally of and circumferentially about said support; said target face comprising:
  (i) first and second target face portions extending along the length of said support structure, said face portions facing away from said support structure in different directions; and,
  (ii) first and second bridging face portions extending between adjacent respective ends of the target face portions;
 (c) electrical connector structure for connecting said support structure to an electric power supply to enable emission of electrons from said cathode; and
 (d) magnetic means for confining electrons emitted from the cathode to a belt-like region extending about the cathode adjacent but spaced from said target and bridging face portions, said magnetic means comprising members extending longitudinally along said support structure and along respective lateral sides of said target face portions, said members effective to direct magnetic fields across said target face portions so that said belt-like region extends substantially completely across the lateral extent of said face portions.

2. The cathode claimed in claim 1 wherein said magnetic means further includes a series of magnetic field producing elements supported by said cathode and disposed at spaced apart locations along and within the perimeter of said target face, said magnetic field producing elements magnetically coupled to said members and effective to cause electrons in said region to move about said cathode.

3. The cathode claimed in claim 2 wherein each of said members defines a peripheral portion extending along one lateral side of said target face portions and said bridging face portions.

4. The cathode claimed in claim 1 wherein said bridging face portions are each defined by a planar surface extending between said target face portions.

5. The cathode claimed in claim 4 wherein said target face portions are planar and generally rectangular.

6. The cathode claimed in claim 5 wherein said target face portions are disposed in generally parallel planes which are spaced apart with said bridging face portions extending transversely between said planes.

7. The cathode claimed in claim 1 wherein said target face portions are defined by generally rectangular plates of material to be sputtered.

8. The cathode claimed in claim 7 wherein said bridging face portions are defined by plates of material separate from said plates of material to be sputtered.

9. The cathode claimed in claim 7 further including means for detachably connecting said target face plates to said support structure, said plates engaged with said support structure by electrically conductive paths.

10. The cathode claimed in claim 9 wherein said target face plates and support structure are in heat conductive engagement and further including heat transfer means attached to said support structure for transfering heat away from said plates and support structure.

11. A system for sputter coating relatively large area substrates comprising:
(a) an evacuable enclosure;
(b) conveyor means for moving substrates to be coated in the enclosure along parallel paths of travel;
(c) an elongated sputtering cathode supported between said paths and extending transversely of the directions of extent of the paths; and
(d) structure for introducing an ionizable gas into said enclosure;
(e) said cathode effective to create a continuous band of plasma extending longitudinally of and circumferentially about the cathode through a region having a first section extending generally parallel to a substrate on one of said paths of travel, a second section spaced laterally from said first section and extending generally parallel to a substrate on the other of said paths of travel, and return sections joining the ends of the first and second sections and extending generally transversely to the direction of extent of the substrate travel paths, said cathode including sputtering material surfaces extending adjacent and parallel to said first and second sections and magnetic field directing means for constraining the plasma flow in said sections to extend substantially uniformly over the sputtering material surfaces.

12. The cathode claimed in claim 11 wherein said magnetic field directing means includes a series of magnetic field producing elements supported by said cathode and disposed at spaced apart locations along and within the perimeter of said cathode.

13. The cathode claimed in claim 12 wherein said magnetic field directing means further includes field conducting members magnetically coupled to said elements, said members extending along respective lateral sides of said sputtering material surfaces.

14. The cathode claimed in claim 11 wherein said sputtering material surfaces are disposed on sides of a band-like rectangular configuration, ends of said rectangular configuration defined by sputtering material surfaces extending adjacent and parallel to the plasma band return sections.

15. The cathode claimed in claim 14 wherein said sputtering material surfaces are defined on plates of sputtering material, said magnetic field directing means including elements for clamping said plates to said cathode.

16. A magnetically enhanced cathode comprising a supporting structure formed from an electrically conductive, magnetically insulative material, target means defining an endless belt shaped surface extending longitudinally of and circumferentially about the cathode, said surface comprising enlongated target surface portions supported by said structure and from which material is sputtered and bridging surface portions, said elongated target surface portions facing away from said cathode in different directions with said bridging surface portions extending between said target surface portions, and magnetic field directing means for directing a magnetic field over all said surface portions to confine electrons emitted from said cathode in a band extending peripherally about the cathode and close to said target surface portions and distributed relatively uniformly across at least said target surface portions, said field directing means comprising first and second magnetic field conductor members extending along said target face portions on opposite lateral sides thereof, the target face portions being recessed with respect to said members, and a plurality of magnets engaging said field conductor members so that said members have opposite magnetic polarities.

* * * * *